(12) United States Patent
Yoo

(10) Patent No.: US 6,633,132 B2
(45) Date of Patent: Oct. 14, 2003

(54) PLASMA GERERATION APPARATUS AND METHOD

(75) Inventor: Woo Sik Yoo, Palo Alto, CA (US)

(73) Assignee: WaferMasters Inc., San Jose, CA (US)

( * ) Notice: Subject to any disclaimer, the term of this patent is extended or adjusted under 35 U.S.C. 154(b) by 107 days.

(21) Appl. No.: 09/767,513

(22) Filed: Jan. 23, 2001

(65) Prior Publication Data

US 2002/0096998 A1 Jul. 25, 2002

(51) Int. Cl.[7] .................................................. H05H 1/00
(52) U.S. Cl. ............................... 315/111.21; 118/723 R
(58) Field of Search ................................. 438/714, 710;
216/68, 71; 118/723 R; 315/111.21, 111.71

(56) References Cited

U.S. PATENT DOCUMENTS

| | | | |
|---|---|---|---|
| 5,336,533 A | | 8/1994 | Balmashnov et al. ....... 427/562 |
| 5,770,098 A | * | 6/1998 | Araki et al. ................... 216/67 |
| 6,050,217 A | | 4/2000 | Li ........................... 118/723 E |
| 6,076,483 A | * | 6/2000 | Shintani et al. ........... 118/723 E |
| 6,253,704 B1 | * | 7/2001 | Savas ....................... 118/723 I |
| 6,335,293 B1 | * | 1/2002 | Luo et al. .................... 345/173 |
| 6,341,574 B1 | * | 1/2002 | Bailey et al. .......... 118/723 AN |
| 6,395,641 B2 | * | 5/2002 | Savas ....................... 118/723 I |

FOREIGN PATENT DOCUMENTS

| | | |
|---|---|---|
| EP | 0063273 | 10/1982 |
| EP | 0480688 A2 | 4/1992 |
| EP | 0792947 A | 9/1997 |

* cited by examiner

Primary Examiner—David Vu
(74) Attorney, Agent, or Firm—MacPherson Kwok Chen & Heid LLP

(57) ABSTRACT

An apparatus and process for processing a substrate using components and particles formed in a remote plasma generation section of a processing chamber. The processing chamber includes a processing section and a plasma generation section. A plasma field is generated in the plasma generation section, such that the plasma field is generated remotely from the processing section. Components and particles from the plasma field can diffuse and/or drift from the plasma generation section through a passageway to the processing section. The processing chamber may include a plurality of plasma generation sections for generating additional plasma fields. In each instance, the additional plasma fields are generated remotely from the processing section.

14 Claims, 3 Drawing Sheets

PLASMA GERERATION APPARATUS AND METHOD

BACKGROUND OF THE INVENTION

1. Field of the Invention

The invention is related to semiconductor processing, and more particularly to a plasma generation apparatus and process for processing a semiconductor substrate with remotely generated plasma.

2. Description of the Related Art

Various systems and methods are well known for processing semiconductor substrates. For example, some processes include depositing thin films and/or dielectric layers on the semiconductor substrates. A typical deposition technique uses plasma generated in a processing chamber during a CVD process (hereinafter "plasma CVD" or "PECVD") to form a thin film layer.

FIG. 1 is a simplified schematic view illustrating the fundamental components of a conventional self-biasing type plasma CVD device 100 used to process the semiconductor substrate. Plasma CVD device 100 uses a radio-frequency (RF) generator (13.56 MHz), to create a glow discharge region between a bottom electrode 102 and a top electrode 104. The RF generator activates a reaction in a gaseous mixture to deposit a film on substrate 106 located on bottom electrode 102. Bottom electrode 102 and top electrode 104 are arranged opposite to one another in a reaction chamber (not shown). Bottom electrode 102 is connected to an external DC electrical power source 108. Top electrode 104 is connected to a radio-frequency generator 110. A grooved mesh electrode 112 is located between bottom electrode 102 and top electrode 104 and a DC bias current is applied between mesh electrode 112 and bottom electrode 102. In this device, ions and radicals incident on the substrate are controlled by applying a direct current flow without grounding bottom electrode 102 supporting substrate 106.

Unfortunately, since the surface of substrate 106 on which the film is deposited is located near the plasma generation region, high-energy particles generated by plasma discharge frequently bombard the substrate surface. This may cause the thin film to deteriorate, become damaged or to be deposited abnormally by the impact of particles having excessive energy.

SUMMARY OF THE INVENTION

The present invention provides an apparatus and associated methods for processing a semiconductor substrate using components and particles of a plasma discharge formed in a remote section of a processing chamber. The present invention reduces the amount of high-energy particles, generated by the plasma discharge, which can bombard the substrate surface. The present invention includes a processing chamber having a processing section and a plasma generation section. A plasma field is generated in the plasma generation section, such that the plasma field is generated outside or away from a substrate disposed in the processing section. Components and particles from the plasma field can diffuse and/or drift from the plasma generation section through a passageway to the processing section to interact with the substrate. Advantageously, the processing chamber may include a plurality of plasma generation sections for generating additional plasma fields. In each instance, the additional plasma fields are generated remotely from the processing section.

In one aspect of the invention, an apparatus is provided for processing a substrate. The apparatus includes a processing chamber and a plasma generation chamber. A plasma is generated in the plasma generation chamber. The processing chamber and the plasma generation chamber include a passageway between them to allow a plasma field component to move from the plasma generation chamber to the processing chamber.

In another aspect of the invention, a plasma generation process is provided for processing a semiconductor substrate. The process includes providing a chamber, which has a first plasma generation section and a processing section. The process also includes generating a first plasma field in the first plasma generation section and moving components of the first plasma field from the first plasma generation section to the processing section. The components interact with a substrate disposed in the processing section.

In another aspect of the present invention, a process is provided for processing a substrate including generating a plasma in a first section of a substrate processing chamber; and moving components proximate to a substrate disposed in a second section of the substrate processing chamber. The first section being remote from the second section.

These and other features and advantages of the present invention will be more readily apparent from the detailed description of the embodiments set forth below taken in conjunction with the accompanying drawings.

BRIEF DESCRIPTION OF THE DRAWINGS

The present invention may be better understood, and its numerous objects, features, and advantages made apparent to those skilled in the art by referencing the accompanying drawings.

The use of the same reference numerals in different drawings indicates similar or identical items.

DETAILED DESCRIPTION

Embodiments of the present invention will be described with reference to the aforementioned figures. These figures have been simplified for ease of describing and understanding the embodiments.

Figure 1:
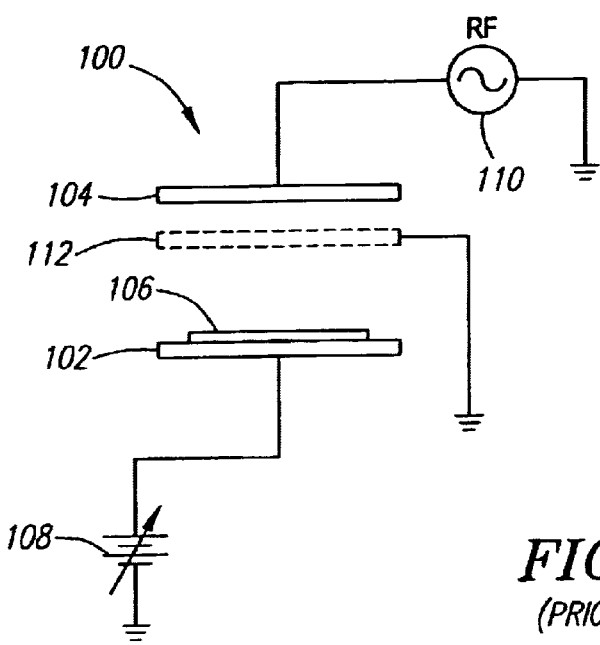
FIG. 1 is a schematic diagram of a typical CVD system.
Figure 2:
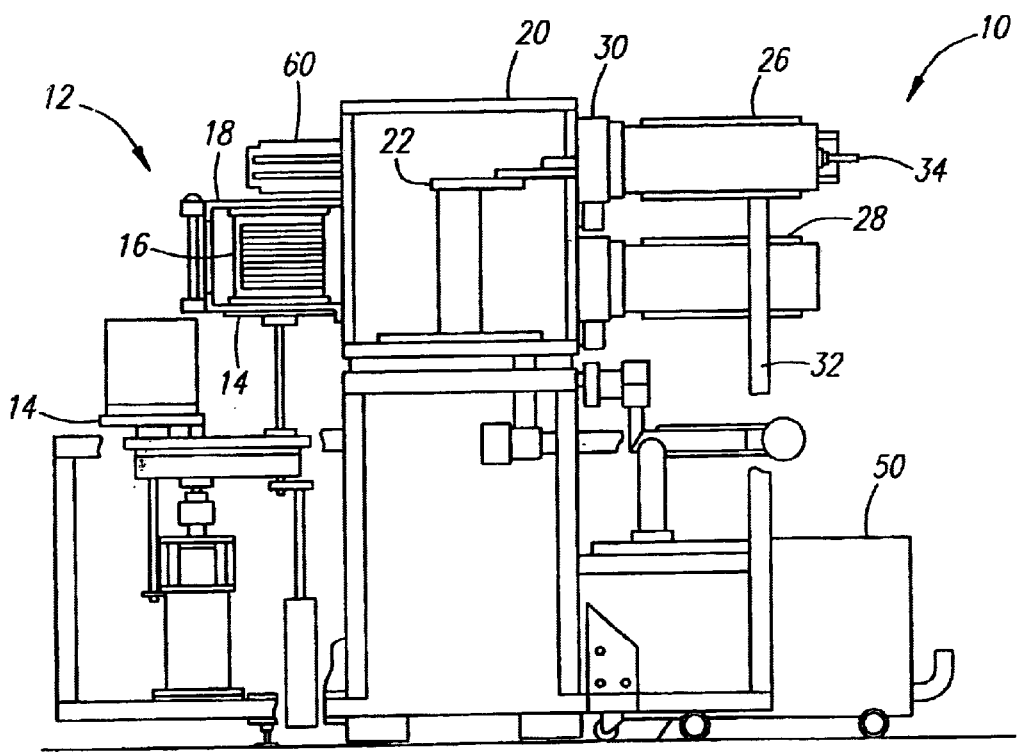
FIG. 2 is an illustration of an embodiment of a representative processing system in accordance with the present invention.

FIG. 2 is a schematic illustration of a side view of one embodiment of a semiconductor wafer processing system 10 that establishes a representative environment of the present invention. A representative system is disclosed in co-pending U.S. patent application Ser. No. 09/451,677, filed Nov. 30, 1999, which is herein incorporated by reference for all purposes. Processing system 10 includes a loading station 12, which has multiple platforms 14 for supporting and moving a wafer cassette 16 up and into a loadlock 18. Wafer cassette 16 may be a removable cassette which is loaded into a platform 14, either manually or with automated guided vehicles (AGV). Wafer cassette 16 may also be a fixed cassette, in which case wafers are loaded onto cassette 16 using conventional atmospheric robots or loaders (not shown). Once wafer cassette 16 is inside loadlock 18, loadlock 18 and transfer chamber 20 are maintained at atmospheric pressure or else are pumped down to a vacuum pressure using a pump 50. A robot 22 within transfer chamber 20 rotates toward loadlock 18 and picks up a wafer from cassette 16. A processing chamber 26, which may also be at atmospheric pressure or under vacuum pressure accepts the wafer from robot 22 through a gate valve 30. In accordance with the present invention, processing chamber 26 may be any processing chamber used for processing a semiconductor substrate, including for example, deposition, etching, ashing, surface treatment, surface modification, plasma processing and similar processes. Processing chamber 26 is bolted onto transfer chamber 20 and is further supported by a support frame 32. Once the wafer is inside the processing chamber 26, robot 22 retracts and, subsequently, gate valve 30 closes to begin the processing of the wafer. After the wafer is processed, gate valve 30 opens to allow robot 22 to pick-up and place the wafer into cooling station 60. Cooling station 60 cools the newly processed wafers before they are placed back into a wafer cassette in loadlock 18.

Figure 3:
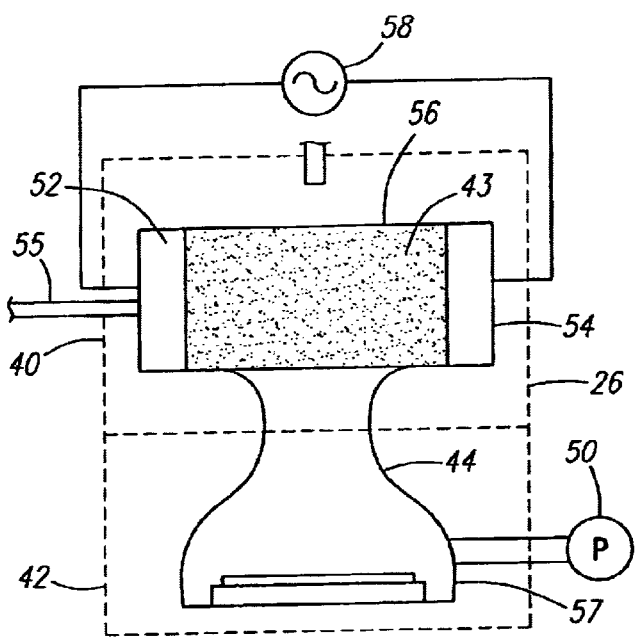
FIG. 3 is a simplified schematic illustration of a processing chamber in accordance with the present invention.

FIG. 3 is a simplified schematic view of an embodiment of processing chamber 26 in accordance with the present invention. Processing chamber 26 includes a plasma generation section 40 and a processing section 42. Plasma generation section 40 and processing section 42 are separated in that the generation of a plasma field 43 occurs in the plasma generation section 40. Sections 40 and 42, however, are configured to be in communication. For example, a passageway or duct 44 can provide a path for components or particles of plasma field to translate over to processing section 42. Duct 44 can be any type of path that allows diffusion and drift of particles between plasma generation section 40 and processing section 42. As understood by one of ordinary skill in the art, diffusion describes, without limitation, the process whereby particles or components of liquids, gases, or solids move from a region of higher to one of lower concentration. Similarly, as understood by one of ordinary skill in the art, drift refers to, without limitation, the process whereby particles or components of liquids, gases, or solids are driven, propelled, or urged along or drawn together by or as if by a natural agency.

Plasma generation section 40 includes a first electrode 52 and a second electrode 54 for reacting vapor phase chemicals to generate plasma field 43. In one embodiment, electrodes 52 and 54 are disposed at opposite ends in a suitable housing, which forms a plasma generation chamber 56. Plasma generation chamber 56 can be designed having any suitable configuration that permits the formation of plasma field 43 within the chamber and provides communication with processing section 42 as through duct 44.

In one embodiment plasma energy is supplied to plasma generation chamber 56 through from an energy source 58, which can supply high-frequency (HF) RF energy, low-frequency (LF) energy, and AC and DC power to electrodes 52 and 54 in chamber 56.

A selected gas, such as is used in semiconductor processes, can be introduced into plasma generation chamber 56 through inlet port 55 being fed from a suitable manifold system from various gas supply reservoirs (not shown). The concentration of the gas can be selectively controlled in accordance with the energy, the pressure, and the process temperature within plasma generation chamber 56.

Figure 4:
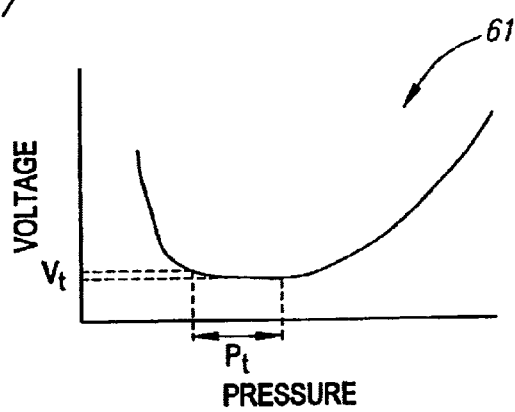
FIG. 4 is a graph of the Breakdown Voltage-Pressure profile of an embodiment of the processing chamber of FIG. 3.

The pressure inside chamber 56 can be controlled to cause diffusion of components and particles of plasma field 43 through duct 44 and into the processing section 42. With reference to graph 61 in FIG. 4, controlling and reducing the pressure in chamber 26 to a range of $P_t$, causes the breakdown voltage used to generate plasma field 43 to be substantially reduced to a range of about $V_t$. Thus, the energy supply to electrodes 52 and 54 can also be substantially reduced. In one embodiment, to achieve pressure in the range $P_t$, pump 50 can be used to pump down processing chamber 26 to reduce the pressure within plasma generation chamber 56 and processing section 42. The ambient pressure range $P_t$ within each section may generally be maintained from about 10 Torr to about $10^{-2}$ Torr, for example 1 Torr. Accordingly, maintaining the pressure within these ranges, the energy $V_t$ can range from 1000 Volts to about 10000 Volts, DC to about 500 MHz. The process temperature $T_t$ can generally range from about 0° C. to about 450° C.

As is known to those of ordinary skill in the art, the plasma energy in chamber 26 ionizes the introduced gases, generating radicals which can interact on a surface of wafer 116 to arrive at the desired product. The preferred reactant gases may include $O_2$, $H_2$, $N_2$, $NH_3$, $SiH_4$ and $ClF_3$, which provide discharge of long-life radicals and ions, such as $F^*$, $N^*$, $O^*$, $H^*$, and $Si^*$.

Figure 5:
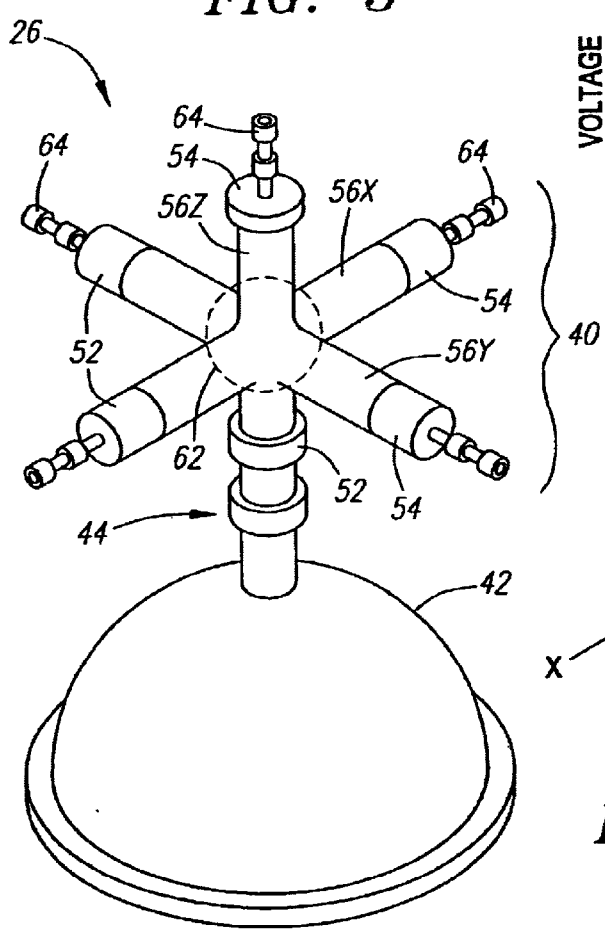
FIG. 5 is a simplified perspective view of an embodiment of the present invention.

FIG. 5 is a simplified illustration of an embodiment of processing chamber 26 in accordance with the present invention. In this embodiment, processing chamber 26 includes plasma generation section 40, processing section 42, and a communication passageway 44, which allows for drift and/or diffusion to occur between the sections. Plasma generation section 40, with no intent to limit the invention, can be formed of a single plasma generation chamber 56 (FIG. 2) or a plurality of plasma generation chambers 56x, 56y, and 56z.

As shown in FIG. 5, each plasma generation chamber 56x, 56y, and 56z can be arranged, relative to each other section, in any suitable configuration that permits the generation of plasma fields within the chambers. In this embodiment, each plasma generation chamber 56x, 56y, and 56z can be arranged to intersect orthogonally. For example, chambers 56x and 56y are oriented in the x-y plane to intersect orthogonally within the x-y plane. Chamber 56z is oriented along a z-axis to intersect chambers 56x and 56y perpendicular to the x-y plane. Because each chamber 56x–z is in communication, as illustrated in FIG. 5, chambers 56x, 56y, and 56z can be formed of a tubular shaped body. The tubular body can be made of any suitable material, such as quartz or a similar material. Electrodes 52 and 54 can be arranged at the ends of each tubular body, such that plasma field can be generated between the electrodes within the tubular body.

Passageway 44 allows components and/or particles of the plasma field generated within one or all of chambers 56x, 56y, and 56z to diffuse or drift into processing section 40. The components and/or particles are allowed to react in a well known manner on the substrate to form the desired product.

Figure 6:
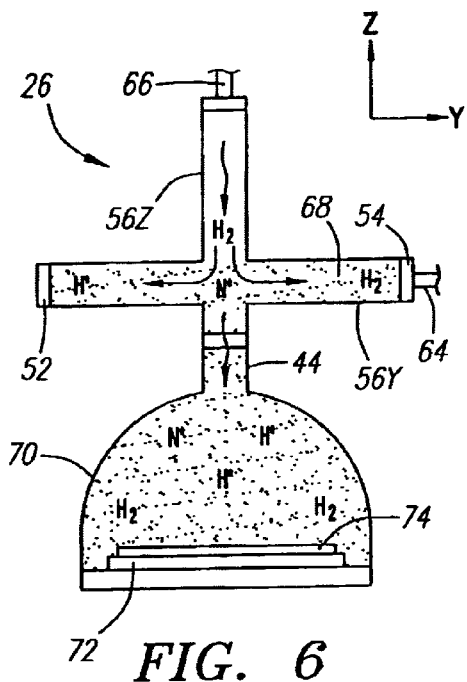
FIGS. 6, 7A, 7B, and 8 are simplified illustrations of embodiments of the present invention.

FIG. 6 is a simplified illustration of the operation of processing chamber 26. In this example, chambers 56y and 56z are shown intersecting at a central portion 62. A selected gas, such as $NH_3$, $N_2$, $N_2O$ and $NO_2$, can be introduced into plasma generation chambers 56y through an inlet port 64. In this example, $NH_3$ is introduced into chamber 56y. The concentration of $NH_3$ can be selectively controlled in accordance with the energy, the pressure, and the process temperature. Plasma energy supplied to electrodes 52 and 54 ionizes the $NH_3$, generating radicals and other components within a plasma field 68, such as $N^*$, $H^*$ and $H_2$. In one embodiment, the radicals can diffuse to processing section 70 through passageway 44 to interact with a surface of wafer 72. Alternatively, a carrier gas, such as $H_2$ can be introduced under pressure into inlet port 66. The carrier gas can travel through chamber 56z, such that the carrier gas moves through plasma field 68 and propels and/or urges the radicals into process section 70. In this example, the $N^*$ radicals react with an Si substrate to form a layer 72 of SiN.

Figure 7A:
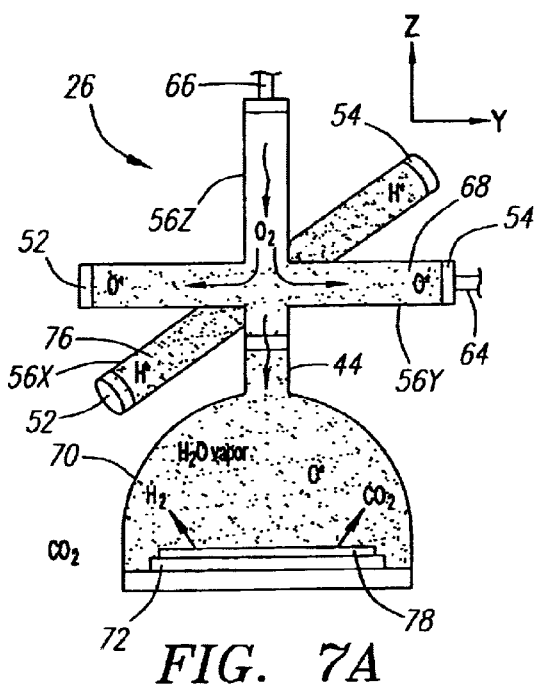
Figure 7B:
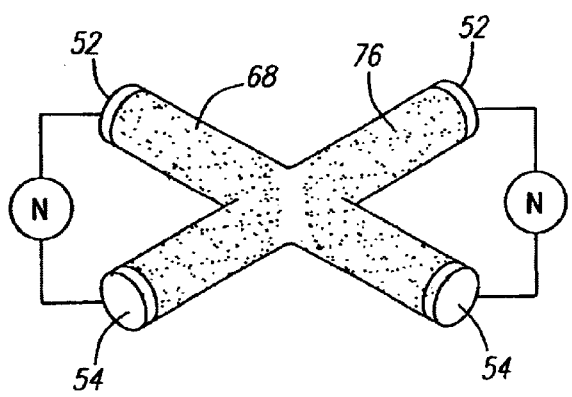

FIG. 7A illustrates another embodiment of chamber 26 in accordance with the present invention. In this example, process chamber 26 is suited for removal of photoresist layer 78. A first gas, such as $H_2$, is introduced into plasma generation chamber 56x. A second gas, such as $O_2$, is introduced into plasma generation chamber 56y. Each gas is ionized and two plasma fields 68 and 76 are formed. Although plasma fields 68 and 76 are shown to intersect, electrodes 52 and 54 can be arranged, such that the plasma fields do not cross as illustrated in the simplified diagram of FIG. 7B.

Referring again to FIG. 7A, a carrier gas, such as $O_2$, is introduced into plasma generation chamber 56z. The carrier gas moves through the plasma fields causing $H^*$ and $O^*$ radicals and $H_2O$ vapor to enter processing section 70. The $O^*$ reacts with the carbon photoresist to form $CO_2$ which is carried away from wafer 72 to remove the photoresist layer 78. Excess $H^*$ radicals form $H_2$ while the $H_2O$ vapor assists in the cleaning away of the photoresist layer 78.

Figure 8:
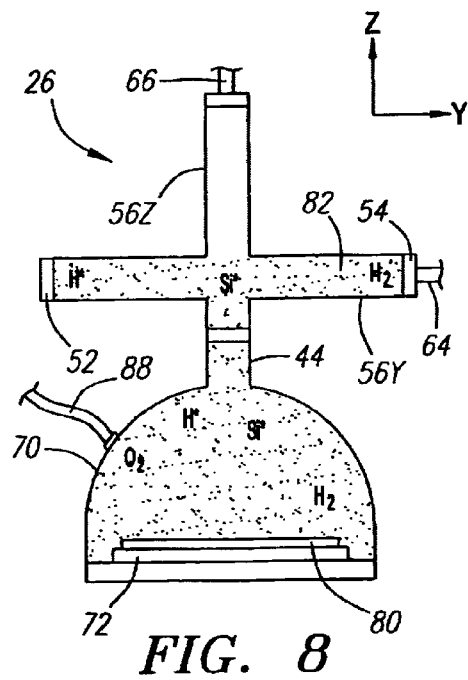

FIG. 8 is a simplified illustration of another embodiment of chamber 26. In this embodiment, process chamber 26 is used to form an $SiO_2$ layer 80 on wafer 72. A first gas, such as $SiH_4$, is introduced into plasma generation chamber 56y through inlet port 64. The gas is ionized and plasma field 82 is formed. Plasma field 82 includes radicals $Si^*$, $H^*$ and $H_2$, which can diffuse to processing section 70. Alternatively, a carrier gas, such as Ar or He, can be introduced into plasma generation chamber 56z to move through plasma field 82 and cause the $Si^*$, $H^*$ and $H_2$ radicals to drift into processing section 70. To avoid the formation of $SiO_2$ particles, which can occur in a gas phase reaction, $O_2$ can be introduced directly into processing section 70 through an inlet port 88. The $O_2$ reacts with $Si^*$ on the surface of the substrate which avoids the formation of $SiO_2$ particles.

While the principles of the invention have been described in connection with specific apparatus, it is to be understood that this description is not a limitation on the scope of the invention.

What is claimed is:

1. An apparatus for processing a substrate, comprising:
    a processing chamber including:
        a processing section;
        a first plasma generation section;
        a passageway disposed therebetween, said first plasma generation section for generating a first plasma field remotely from said processing section, said passageway configured to allow particles from said first plasma field to translate from said first plasma generation section to said processing section;
        a second plasma generation section in environmental communication with said first plasma generation section for generating a second plasma field, said passageway configured to allow particles from said second plasma field to translate from said second plasma generation section to said processing section, said first plasma field and said second plasma field generated from different sources.

2. The apparatus of claim 1, further comprising a third plasma generation section in environmental communication with said first plasma generation section and said second plasma generation section for generating a third plasma field, said passageway configured to allow particles from said third plasma field to translate from said third plasma generation section to said processing section.

3. The apparatus of claim 1, wherein said first plasma generation section comprises a first electrode and a second electrode for reacting vapor phase chemicals to generate said first plasma field.

4. The apparatus of claim 3, further comprising a power source coupled to said first and said second electrodes, said power source taken from the group consisting of AC, DC, RF and microwave power sources.

5. The apparatus of claim 1, further comprising at least one inlet port for supplying said first plasma generation section with vapor phase chemicals.

6. An apparatus for processing a semiconductor substrate, comprising:
    a processing chamber; and
    a first plasma generation chamber for generating a first plasma field; and
    a second plasma generation chamber for generating a second plasma field, said first plasma field and said second plasma field having different plasma field components, said first and said second plasma generation chambers configured to allow said first plasma field and said second plasma field to intersect at an area of intersection,
    said processing chamber and said first and second plasma generation chambers including a passageway between them to allow first and second plasma field components to move from said area of intersection to said processing chamber.

7. The apparatus of claim 6, wherein said first and second plasma field components drift from said area of intersection to said processing chamber.

8. The apparatus of claim 6, wherein said first and second plasma field components diffuse from said area of intersection to said processing chamber.

9. The apparatus of claim 6, wherein said first and second plasma chambers each comprise a first electrode and a second electrode for reacting vapor phase chemicals to generate said first and second plasma fields, a power source coupled to first and said second electrodes, said power source taken from the group AC, DC, RF and microwave power sources.

10. The apparatus of claim 6, further comprising an inlet port for vapor phase chemicals into each of said first and second plasma generation chambers.

11. The apparatus of claim 6, further comprising an inlet port for introducing a process gas into said processing chamber.

12. A plasma generation process comprising:
    providing a chamber including a first plasma generation section, a second plasma generation section, a processing section and a passageway therebetween;
    generating a first plasma field in said first plasma generation section;
    generating a second plasma field in said second plasma generation section, said first plasma field and said second plasma field generated from different sources, said first and said second plasma fields intersecting at an intersection area; and
    moving components of said first and said second plasma fields from said intersection area through said passageway to said processing section.

13. The process of claim 12, wherein said moving comprises allowing said components to drift or diffuse.

14. The process of claim 12, further comprising generating a third plasma field in a third plasma generation section of said chamber, said third plasma field intersecting said first and said second plasma fields in said intersection area.

* * * * *

UNITED STATES PATENT AND TRADEMARK OFFICE
CERTIFICATE OF CORRECTION

PATENT NO. : 6,633,132 B2
DATED : October 14, 2003
INVENTOR(S) : Yoo, Woo Sik

It is certified that error appears in the above-identified patent and that said Letters Patent is hereby corrected as shown below:

<u>Title page, Item [54] and Column 1, line 1,</u>
Title should read as follows:
-- PLASMA GENERATION APPARATUS AND METHOD --.

Signed and Sealed this

Twenty-seventh Day of January, 2004

JON W. DUDAS
*Acting Director of the United States Patent and Trademark Office*